United States Patent [19]
Yoshida et al.

[11] Patent Number: 5,017,277
[45] Date of Patent: May 21, 1991

[54] LASER SPUTTERING APPARATUS

[75] Inventors: Yoshikazu Yoshida; Kunio Tanaka; Yukio Nishikawa; Yusuke Takada, all of Osaka, Japan

[73] Assignee: Matsushita Electric Industrial Co., Ltd., Osaka, Japan

[21] Appl. No.: 376,087

[22] Filed: Jul. 6, 1989

[30] Foreign Application Priority Data

Jul. 7, 1988 [JP] Japan ................................. 63-169440
Dec. 21, 1988 [JP] Japan ................................. 63-322647
Feb. 10, 1989 [JP] Japan ..................................... 1-31791

[51] Int. Cl.$^5$ .............................................. C23C 14/34
[52] U.S. Cl. ............................. 204/298.02; 204/192.1; 204/192.22; 204/298.11; 427/53.1
[58] Field of Search ............ 204/192.1, 298 R, 298 C, 204/298 MS; 118/50.1; 427/53.1

[56] References Cited

U.S. PATENT DOCUMENTS

4,664,769 5/1987 Cuomo et al. .................... 204/192.1

FOREIGN PATENT DOCUMENTS

252010 12/1987 Fed. Rep. of Germany ...... 204/298 MT
3800680 7/1989 Fed. Rep. of Germany ..... 427/53.1
646578 1/1986 U.S.S.R. .......................... 204/298 R

OTHER PUBLICATIONS

D. Lubben et al., *J. Vac. Sci. Technol.* vol. B3 No. 4, Jul./Aug. 1985, pp. 968–974.

*Primary Examiner*—Aaron Weisstuch
*Attorney, Agent, or Firm*—Panitch, Schwarze, Jacobs & Nadel

[57] ABSTRACT

A laser sputtering apparatus has a vacuum chamber, a target holder installed in the vacuum chamber, arranged to oppose the target in the vacuum chamber, a substrate mounted on the substrate support, and a laser beam source which emits laser beams onto the target through a window provided in the vacuum chamber wall, providing a laser sputtering apparatus that supplies dielectric thin films with a high permittivity and a high withstanding voltage.

10 Claims, 5 Drawing Sheets

LASER SPUTTERING APPARATUS

BACKGROUND OF THE INVENTION

1. Field of the Invention

This invention relates to a laser sputtering apparatus by which thin films are produced and a method for the production of dielectric thin films by using the laser sputtering apparatus.

2. Description of the Prior Art

FIG. 6 shows a conventional sputtering apparatus that is provided with a vacuum chamber 1. In the vacuum chamber 1 are disposed a substrate support 2 and a target holder 4, which is electrically insulated from the vacuum chamber 1 by means of an insulator 3. Argon gas is introduced into the vacuum chamber 1 through a gas inlet port 5 to keep the atmosphere in the vacuum chamber at a pressure $10^{-2}$–$10^{-3}$ Torr by means of a vacuum pump connected to an exhaust port 6. When a high frequency voltage is applied to the target holder 4 by means of a power source 7, plasma 8 is generated in a space between the substrate support 2 and the target holder 4.

When a raw material 9 of a dielectric substance is placed on the target holder 4, ions included in the plasma 8 strike the surface of the raw material 9, causing the sputtering effect to form a dielectric thin film on a substance 10 which is set on the substrate support 2.

However, most of the particles emitted from the raw material ($SrTiO_3$, for example) are atoms or molecules, so that the dielectric thin film formed with the substrate support 2 whose surface temperature is relatively low (below 300° C., for example) is amorphous and the dielectric thin film formed with the substrate support 2 whose surface temperature is relatively high (over 300° C., for example) is polycrystalline. As a result, when the thickness of the dielectric thin film is 1,000 A–10,000 A, the permittivity of the dielectric film is as low as 30–35 when it is amorphous, and the withstanding voltage of the dielectric film is low when it is polycrystalline.

SUMMARY OF THE INVENTION

The laser sputtering apparatus of this invention, which overcomes the above-discussed and numerous other disadvantages and deficiencies of the prior art, comprises a vacuum chamber, a target holder installed in the vacuum chamber, a target mounted on the target holder, a substrate support arranged to oppose the target in the vacuum chamber, a substrate mounted on the substrate stage, and a laser beam source which emits laser beams onto the target through a window provided in the vacuum tank wall.

In a preferred embodiment, the substrate is heated to a temperature ranging from 0 to 500° C.

In a preferred embodiment, the material of said target is $SrTiO_3$.

In a preferred embodiment, the inside of said vacuum chamber is maintained at $10^{-2}$ to $10^{-3}$ Torr.

The laser sputtering apparatus of this invention can comprise a vacuum chamber, a target holder installed in the vacuum chamber, a target mounted on the target holder, a substrate support arranged to oppose the target in the vacuum chamber, a substrate mounted on the substrate stage, a window provided in the vacuum chamber through which the laser beam source emits a pulse laser beam onto the target, a disk having a slit or a hole provided within the vacuum tank to cover the window, and a drive motor for rotating the disk, wherein the frequency of the pulse laser beam is equal to the frequency of revolution of the drive motor.

In a preferred embodiment, when the slit or hole of said disk passes said window, the pulse laser beam passes through said slit or hole of said disk.

The laser sputtering apparatus of this invention can also comprise a vacuum chamber that has a gas inlet port, a target holder installed in the vacuum chamber, a target mounted on the target holder, a substrate stage arranged to oppose the target in the vacuum chamber, a substrate mounted on the substrate stage, a laser beam source that emits a laser beam onto the target through a window provided in the vacuum chamber, and a high-frequency power-applying means that feeds high frequency electric power to the target holder.

In a preferred embodiment, oxygen gas is introduced into said vacuum tank from said gas inlet port.

In a preferred embodiment, a mixture of oxygen gas and argon gas is introduced into said vacuum tank from said gas inlet port.

In a preferred embodiment, the frequency of said high frequency electric power is 13.56 MHz.

The method for the production of dielectric thin films with a high permittivity comprises sputtering simultaneously clusters and atoms out of a raw material that is placed within the vacuum chamber, and depositing these particles onto a substrate that is placed within said vacuum chamber, resulting in an amorphous dielectric thin film into which said clusters diffuse as a stable crystalline phase.

In a preferred embodiment, the raw material is irradiated with a pulse laser so as to simultaneously generate said clusters and said atoms therefrom.

Thus, the invention described herein makes possible the objectives of (1) providing a laser sputtering apparatus that produces dielectric films of a high permittivity and a high withstanding voltage; (2) providing a laser sputtering apparatus that is capable of applying a laser beam to a target in a stable condition while preventing sputtered material from sticking onto the window through which the laser beam passes; (3) providing a laser sputtering apparatus that does not generate any region which lacks oxygen in thin films formed on a substrate; and (4) providing a method for the production of dielectric films by the use of the above-mentioned apparatus.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
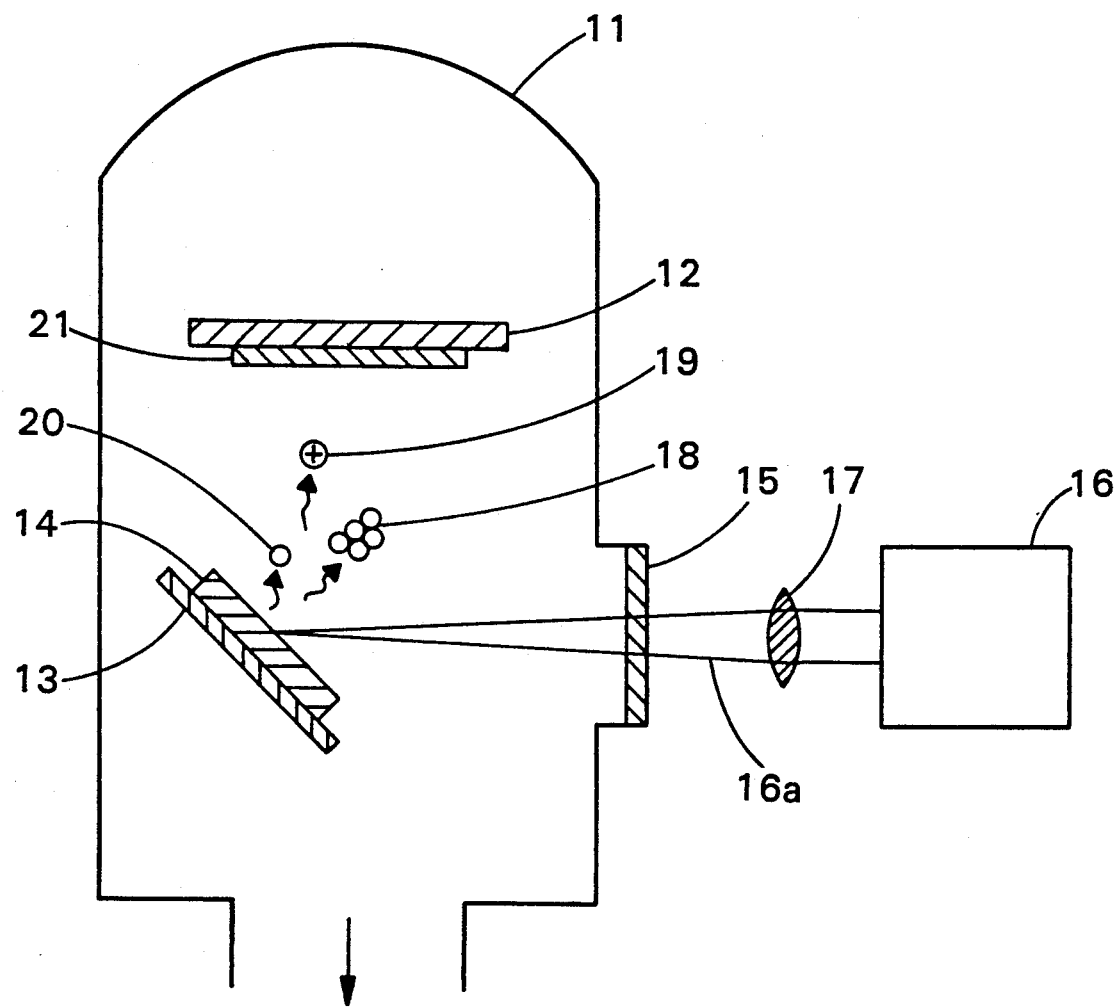
FIG. 1 is a schematic diagram showing a laser sputtering apparatus of this invention.

FIG. 1 shows a laser sputtering apparatus of this invention, which comprises a vacuum chamber 11. In the vacuum chamber 11 are disposed a substrate support 12 and a target holder 13 on which a raw material 14 of dielectric substance ($SrTiO_3$, for example) is placed. A laser 16 (e.g., excimer laser of KrF) is provided outside of the vacuum chamber 11. A laser beam 16a from a laser beam source 16 is focused by means of a lens 17 through a window 15 provided in the vacuum chamber 11 onto the raw material 14.

Figure 2:
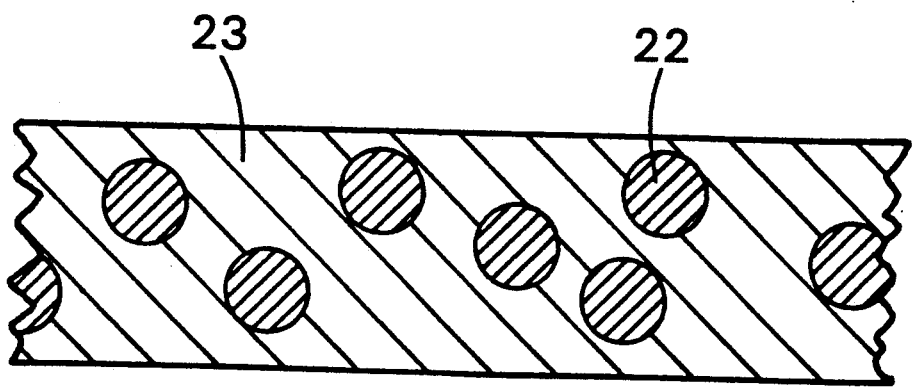
FIG. 2 is a schematic diagram showing the surface condition of a thin film formed by the apparatus.

When the laser beam 16 is adjusted to 100 $MW/cm^2$ output power, 100 ns pulse duration and 10 Hz frequency, for example, clusters 18, ions 19, atoms 20, and the like are sputtered out of the surface of the raw material 14. These particles deposit onto a substrate 21 which is placed on the substrate support 12 to form a dielectric thin film. As shown in FIG. 2, the clusters 18 diffuse into the dielectric thin film as a stable crystalline phase 22, and ions 19 and atoms 20 develop into an amorphous phase 23 when the surface temperature of the substrate support 12 is 300° C. or below.

As a result, because the stable crystalline phase 22 is considered to have polarized spontaneously, it shows a high permittivity when a voltage is applied in the direction perpendicular to the surface. Moreover, because the stable crystalline phase 22 is covered by the amorphous phase 23, grain boundaries do not exist and therefore leakage current is reduced, resulting in a high withstanding voltage.

In this example, a $SrTiO_3$ film of 3000 A thickness with a withstanding voltage of 50 V and a permittivity of 80 was obtained.

The higher the surface temperature of the substrate support 12, the larger the grain size of the stable crystalline phase 22 and therefore the higher the permittivity. In the case of $SrTiO_3$, for example, temperatures above 300° C. cause crystallization also in the amorphous phase 23, resulting in a decrease of the withstanding voltage. In the case of other materials, the advantageous effects of the invention are achieved only in a temperature range within 500° C.

As described above, in accordance with the example of the invention, a dielectric thin film of high permittivity and high withstanding voltage can be obtained.

Example 2

Figure 3:
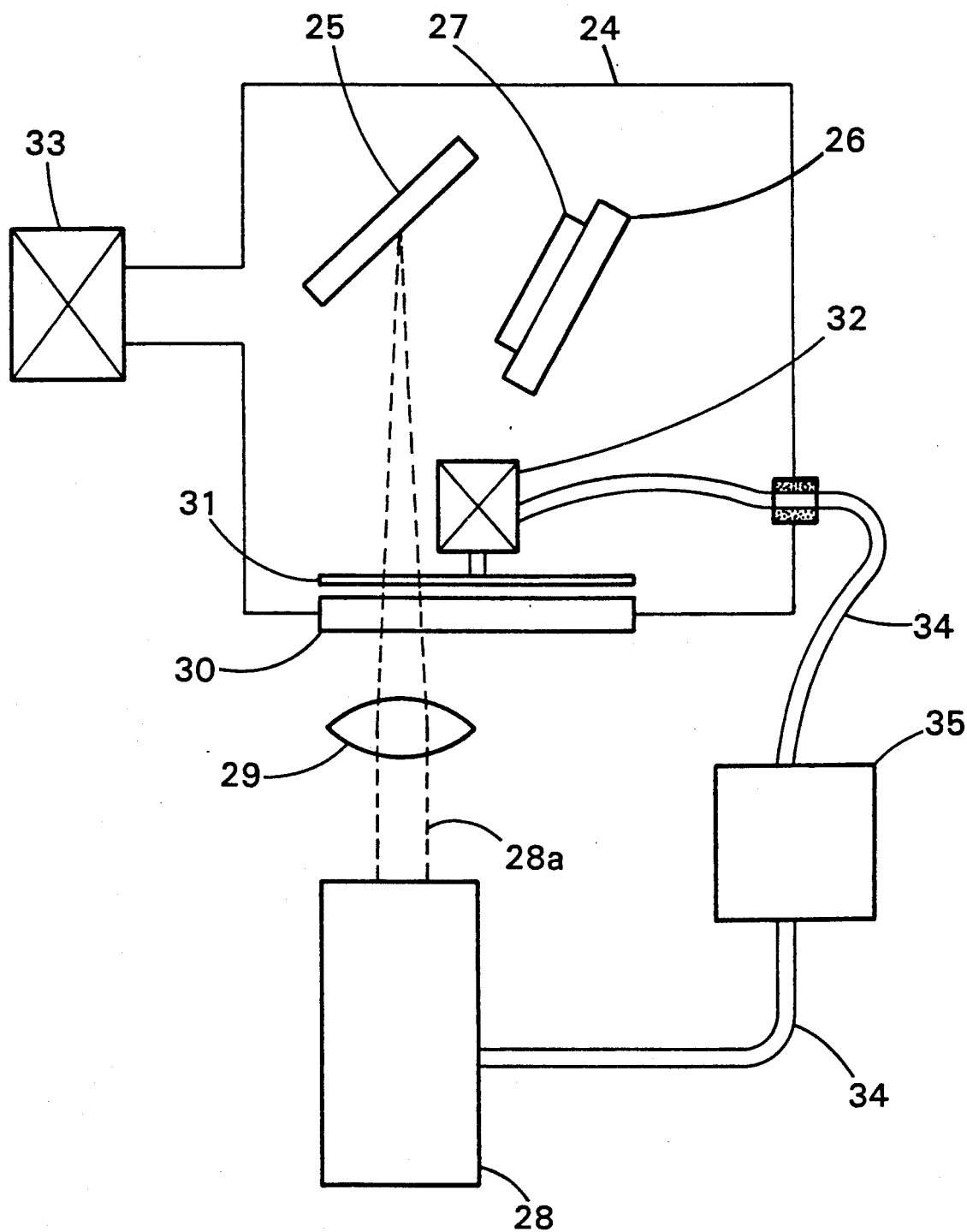
FIG. 3 is a schematic diagram showing another laser sputtering apparatus of this invention.

FIG. 3 shows another laser sputtering apparatus of this invention, which is characterized by a disk 31 arranged to oppose the window 30 in the vacuum chamber 24 provided for the purpose of preventing the sputtered material from sticking onto the window 30.

Figure 4:
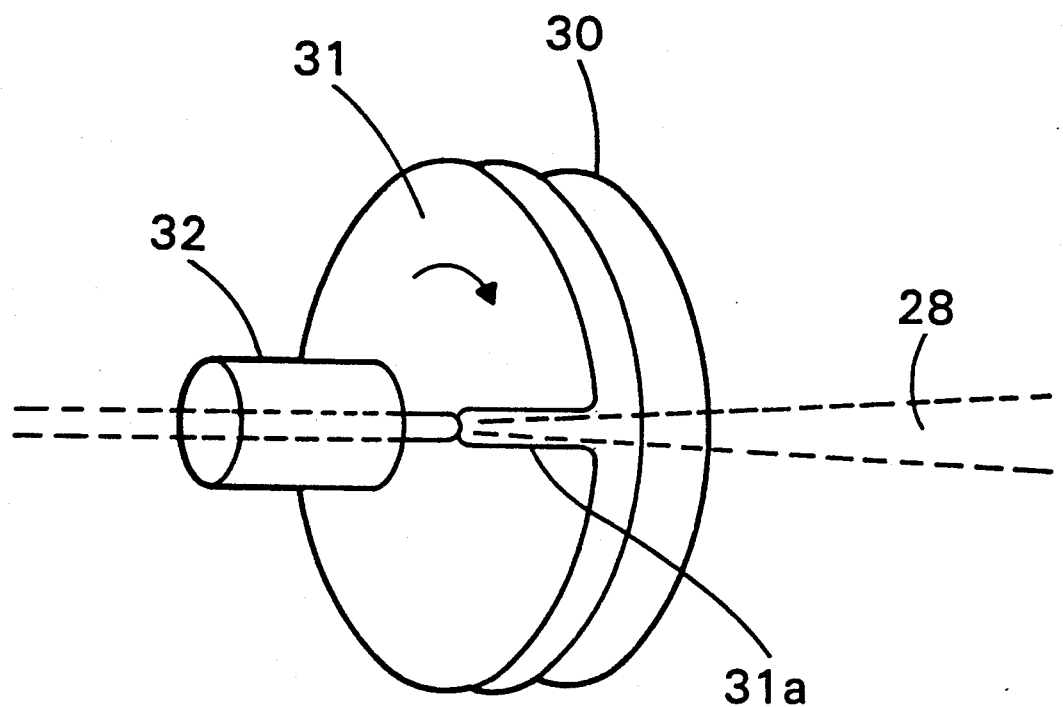
FIG. 4 is a perspective view showing the principal portion of the apparatus shown in FIG. 3.

Inside of the vacuum chamber 24 a target 25 and a substrate support 26 which opposes the target 25 are disposed. A substrate 27 is set on the substrate support 26. A laser beam 28a with a wavelength of 249 nm emitted from a laser beam source 28 (e.g., a KrF excimer laser) is focused by a lens 29 and is applied to the target 25 through a vacuum sealing window 30 that is provided on the vacuum chamber 24, to form a film of the target material on the substrate 27. As shown in FIG. 4, disk 31 has a slit 31a provided on the vacuum side and covers the entire area of the vacuum sealing window 30. The disk 31 can be rotated by a drive motor 32 mounted at the center of the disk 31. In FIG. 3, the reference numeral 33 indicates an exhaust line of the vacuum system.

The drive motor 32 and the laser beam source 28 are connected to the synchronization circuit 35 by means of wiring 34 so that the frequency of the pulse laser beam 28a is identical with the frequency of the revolution of the drive motor 32.

This laser sputtering apparatus is operated as follows: The disk 31 has a slit 31a, for example, 5 mm wide and 40 mm long, which permits the laser beam 28a to pass therethrough with a tight margin, and which is arranged in the radial direction. For example, when the laser beam 28a is emitted at a frequency of 10 Hz with a pulse duration of 17 nsec, the synchronization circuit 35 drives the drive motor 32 at a speed of 10 revolutions per second. By operating the arrangement so that the slit of the disk 31 just comes in a position which passes the laser beam 28a when the laser beam 28a passes the vacuum sealing window 30, the target 25 is irradiated by the laser beam 28a while the material sputtered toward the vacuum sealing window 30 is intercepted by the disk 31 (FIG. 4).

Although a KrF excimer laser is used for the laser to form the laser beam source 28 in this example, other types of pulse laser can also achieve the same effect. Moreover, although the disk 31 has the slit 31a, a disk with a round hole can also achieve the same effect. Although the drive motor 32 is provided in the vacuum chamber 24 in this example, it can be installed outside of the vacuum chamber so that the disk 31 is rotated.

As described above, in accordance with this example, by providing a rotating disk which has a slit or a hole on the inside of the vacuum sealing window used to introduce laser beams, and synchronizing the rotation of the disk with the laser pulse frequency, coating of the sputtered material on the window is made unlikely, in addition to the effect achieved by the first example, which makes it possible to apply a laser beam to the target stably for a long period of time.

Example 3

Figure 5:
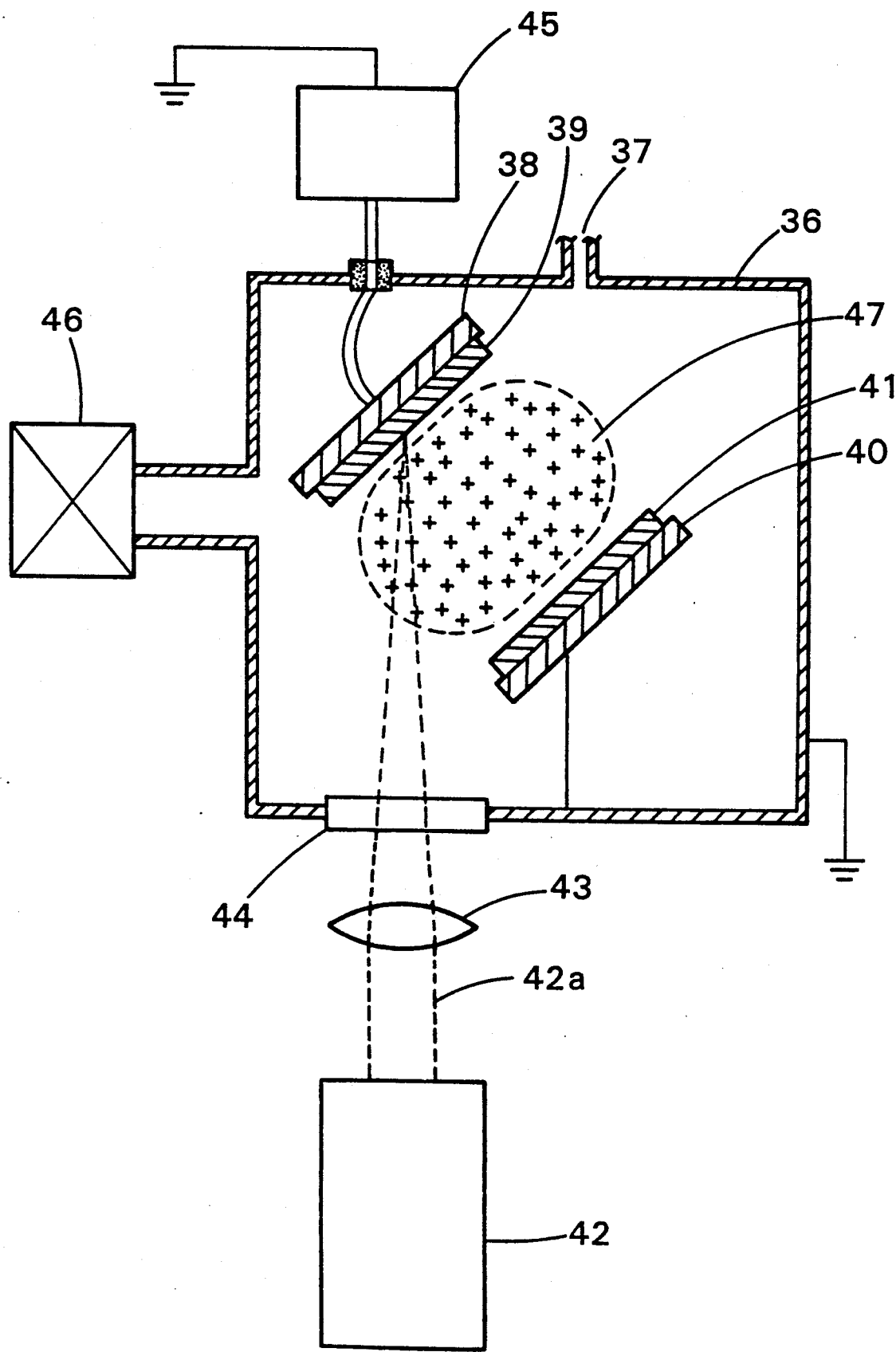
FIG. 5 is a schematic diagram showing another laser sputtering apparatus of this invention.
Figure 6:
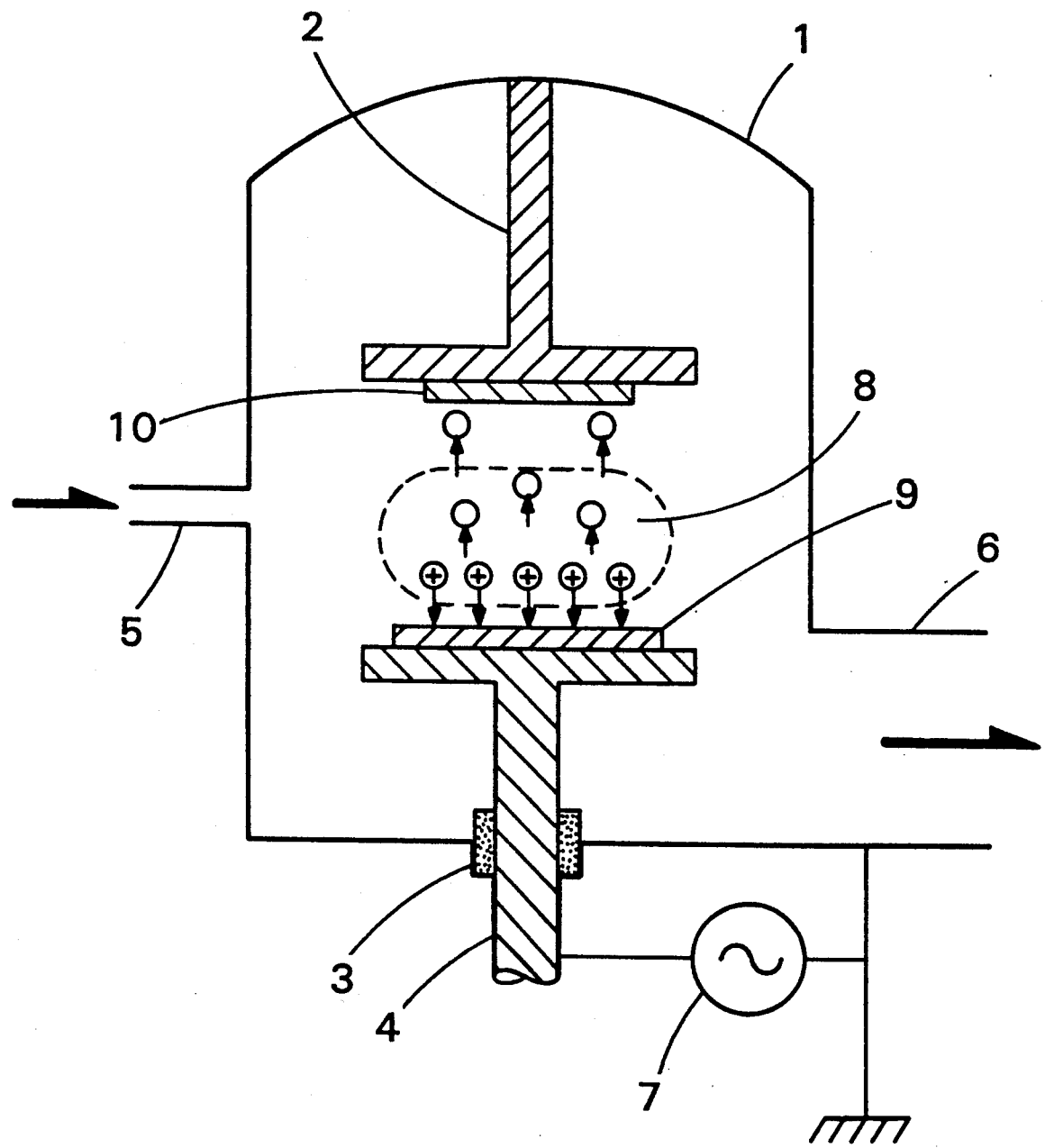
FIG. 6 is a schematic diagram showing a conventional laser sputtering apparatus.

FIG. 5 shows another laser sputtering apparatus of this invention, which has means for introducing oxygen gas into a vacuum chamber 36 to prevent depletion of oxygen in a thin film formed on a substrate 41. The vacuum chamber 36 has a gas inlet port 37. A target holder 38, which bears a target 39 thereupon, is positioned in the vacuum chamber 36. On a substrate support 40 which is arranged to oppose the target 39 in the vacuum chamber 36 is placed a substrate 41. Laser beams 42a from a laser beam source 42 such as a KrF excimer laser or the like with a wavelength of 249 nm are focused by a lens 43 onto the target 39 through a vacuum sealing window 44 provided on the vacuum chamber 36, to form a film on the substrate 41. High frequency electric power can be applied to the target holder 38 by a high frequency power generator 45. The reference numeral 46 indicates an exhaust line of the vacuum system.

This laser sputtering apparatus is operated as follows: Oxygen gas and argon gas mixed in a proportion of 1 to 4 are introduced through the gas inlet port 37 to maintain the gas pressure in the vacuum tank 36 at a pressure of $10^{-2}$–$10^{-3}$ Torr. When a high frequency voltage of 13.56 MHz with a power of 100 W, for example, is applied to the target holder 38, plasma 47 is generated in a space between the target 39, and the substrate 41. By sputtering of the target 39, by oxygen ions and radicals included in the plasma, the target 39 is fed with oxygen which compensates for the oxygen purged from the target 39 by the laser irradiation, at the same time supplying oxygen to the thin film formed on the substrate 41.

Although a KrF excimer laser is used in this example, the same effects can be achieved by using other types of laser. Although the high frequency power generator operates at a frequency of 13.56 MHz in this example, the same effects can be achieved with a high frequency selected from frequencies including those of the microwave region.

As described above, in accordance with this example, depletion of oxygen in the thin film due to the separation and sputtering of oxygen during the formation of oxide films by sputtering with a laser beam is prevented by the use of oxygen plasma generated by high frequency power which supplies oxygen to both the target and the formed film, enabling it to form thin films of a stoichiometric composition.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A laser sputtering apparatus, comprising a vacuum chamber, a target holder mounted in the vacuum chamber, a substrate support arranged to oppose a target mounted on said holder in the vacuum chamber, a pulsed laser beam source which emits pulsed laser beams onto the target through a window provided in the vacuum chamber wall, movable slit means aligned with said window for controllably passing the pulsed laser beams into said chamber, and means for synchronizing the position of said slit means with respect to the frequency of said pulsed laser beams.

2. A laser sputtering apparatus according to claim 1, wherein said chamber has a gas inlet port and gas supply means for introducing gas into said chamber through said port.

3. A laser sputtering apparatus according to claim 1, further comprising high-frequency power-applying means which feeds high frequency electric power to the target holder.

4. A laser sputtering apparatus according to claim 3 wherein the frequency of said high frequency electric power is 13.56 MHz.

5. A laser sputtering apparatus, comprising a laser beam source, a vacuum chamber, a target holder installed in the vacuum chamber, a substrate support arranged to oppose the target in the vacuum chamber, a window provided in the vacuum chamber through which the laser beam source emits a pulsed laser beam onto the target, a disk having a slit or a hole provided within the vacuum chamber to cover the window, and a drive motor for rotating the disk, wherein the frequency of the pulsed laser beam is equal to the frequency of revolution of the drive motor.

6. A laser sputtering apparatus according to claim 5 with means for synchronizing said disk and said motor so that when said slit or hole of said disk passes said window, the pulsed laser beam passes through said slit or hole of said disk.

7. A laser sputtering apparatus according to claim 5, wherein said chamber has a gas inlet port and gas supply means for introducing gas into said chamber through said support.

8. A laser sputtering apparatus according to claim 5, further comprising high-frequency power-applying means which feeds high frequency electric power to the target holder.

9. A laser sputtering apparatus according to claim 8 wherein the frequency of said high frequency electric power is 13.56 MHz.

10. A laser sputtering apparatus according to claim 5, further comprising a target mounted on said holder, said target comprising $SrTiO_3$.

* * * * *